United States Patent
Sakakibara

[11] Patent Number: 5,771,080
[45] Date of Patent: Jun. 23, 1998

[54] TELEVISION SIGNAL TUNING DEVICE

[75] Inventor: Shigeto Sakakibara, Daito, Japan

[73] Assignee: Funai Electric Co., Ltd., Daito, Japan

[21] Appl. No.: 588,706

[22] Filed: Jan. 19, 1996

[30] Foreign Application Priority Data

Jan. 19, 1995 [JP] Japan .................................. 7-000573

[51] Int. Cl.$^6$ ...................................................... H04N 5/50
[52] U.S. Cl. .......................... 348/731; 348/732; 348/725; 348/735
[58] Field of Search ................................... 348/731, 725, 348/732, 735

[56]  References Cited

U.S. PATENT DOCUMENTS

| | | | |
|---|---|---|---|
| 4,038,689 | 7/1977 | Rzeszewski | 348/731 |
| 4,106,059 | 8/1978 | Henderson | 348/731 |
| 4,337,486 | 6/1982 | Akutsu | 348/731 |
| 4,360,832 | 11/1982 | Rzeszewski | 348/731 |
| 4,451,850 | 5/1984 | Kamemoto | 348/731 |
| 4,743,968 | 5/1988 | Mogi et al. | 358/147 |
| 4,751,574 | 6/1988 | Mogi et al. | 358/147 |
| 5,034,819 | 7/1991 | Tsukagoshi | 348/731 |
| 5,107,335 | 4/1992 | Nishiyama et al. | 358/195.1 |

*Primary Examiner*—Glenton B. Burgess
*Attorney, Agent, or Firm*—Bacon & Thomas

[57] ABSTRACT

A television signal tuning device having a memory which is adapted to store central frequency data for starting a synchronizing-signal detecting operation for all the channels and frequency division ratio data thereof. In a data presetting operation for each of the channels, a CPU causes a phase-locked loop circuit to perform a phase-locking operation for every data piece of the central frequency data or frequency division ratio data thereof which are stored in the memory for each channel. When the CPU detects a synchronizing signal from a video signal processing circuit in any one of the phase-locking operations which are successively performed by the phase-locked loop circuit, the CPU immediately renews the channel number and the tuning data thereof in the memory without performing the detection of an AFC variation. This feature greatly reduces the period of time required for the data presetting operation for each channel.

7 Claims, 5 Drawing Sheets

TELEVISION SIGNAL TUNING DEVICE

BACKGROUND OF THE INVENTION

1. Field of the Invention

This invention relates to a television signal tuning device, and more particularly to a television signal tuning device having a phase-locked loop tuner section which is provided for a signal receiver adapted to receive broadcasting waves such as television broadcasting waves.

2. Description of the Related Art

Figure 4:
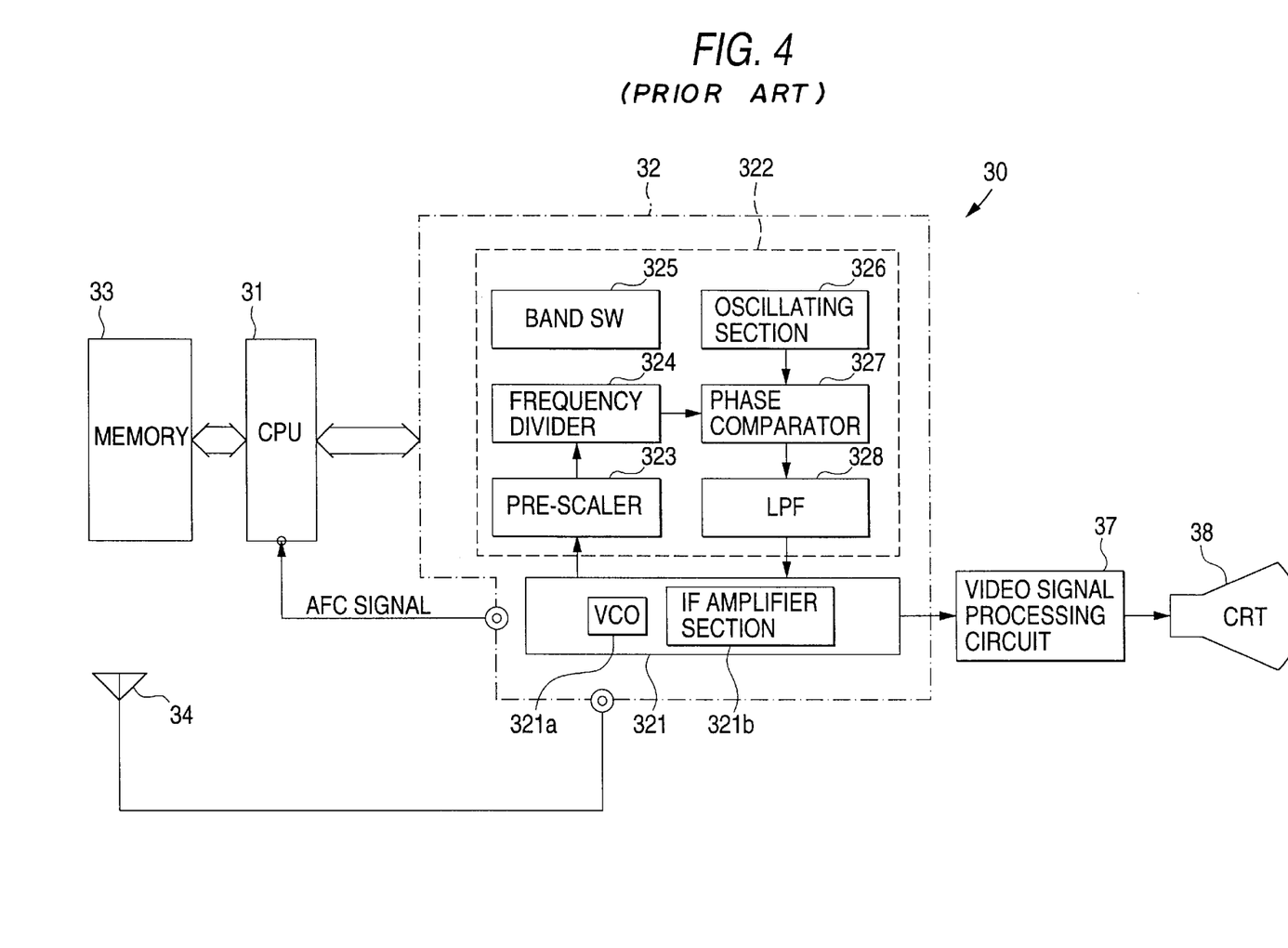
FIG. 4 is a block diagram showing a conventional television signal tuning device.
Figure 5:
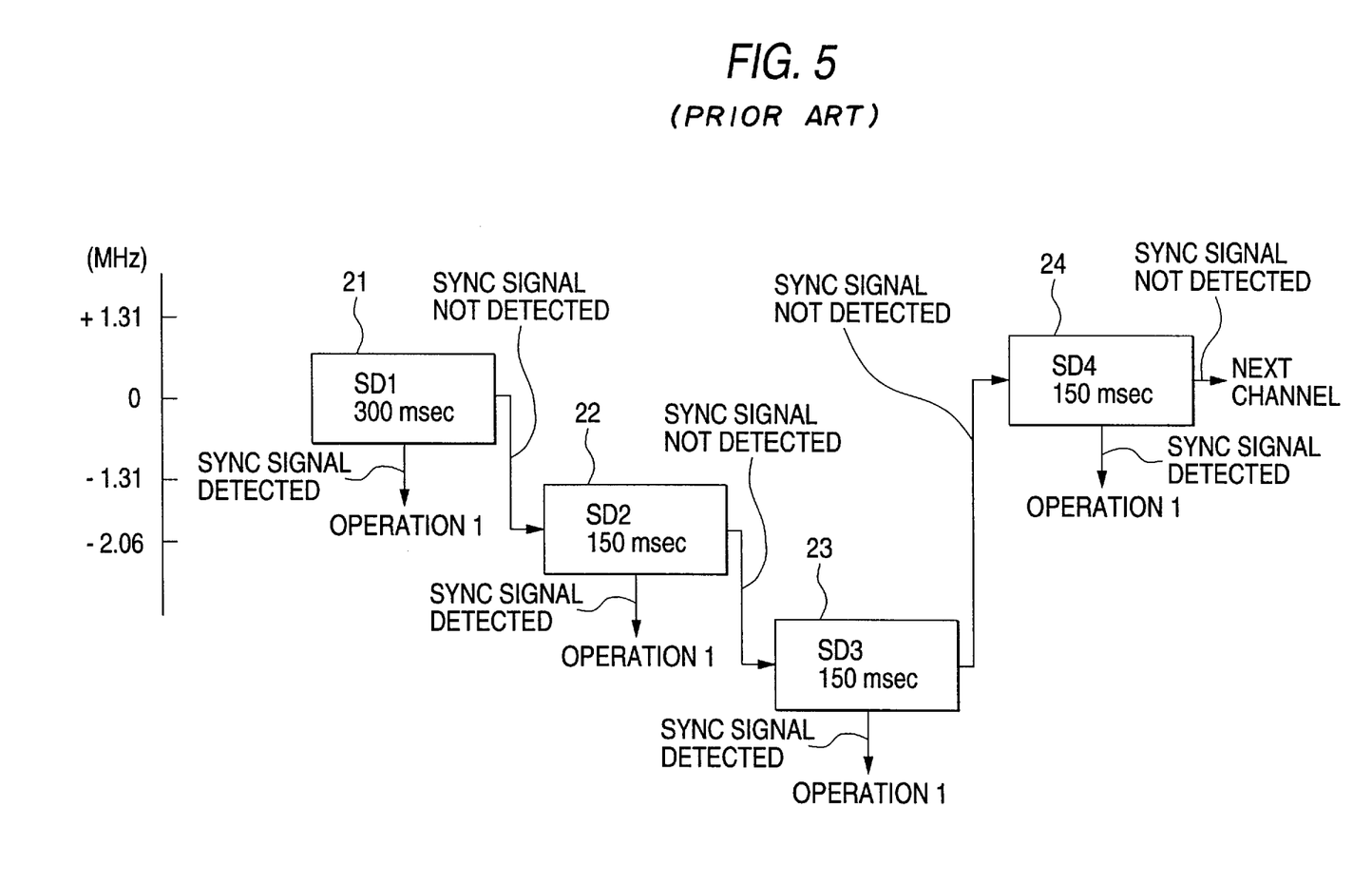
FIG. 5 is an explanatory diagram for a description of a data presetting operation in the conventional device shown in FIG. 4.

Some of the signal receivers adapted to receive broadcasting waves such as television broadcasting waves have a television signal tuning device equipped with a phase-locked loop tuner section (hereinafter referred to as "a PLL tuner section", when applicable). Such a conventional device is as shown in FIG. 4. FIG. 5 is an explanatory diagram for a description of the operation of the conventional device.

In FIG. 4, reference numeral 31 designates a system control section made up of a microcomputer (hereinafter referred to as "a CPU", when applicable); 32, a PLL tuner section which is tuned to a signal-receiving channel selected; and 33, a memory for storing the channel number of the signal receiving channel selected and the like. The PLL tuner section 32 includes a tuner/IF section 321 and a PLL circuit 322.

The PLL circuit 322 includes: a band switch 325; an oscillating section 326 for outputting a reference oscillating frequency signal of 4 MHz; a phase comparator 327; a low-pass filter 328; a pre-scaler 323; and a frequency divider 324. The tuner/IF section 321 includes: a VCO 321a which functions as a tuner section for receiving the signal of a selected channel and a part of the PLL circuit 322; and an intermediate frequency (IF) amplifier section 321b.

Further in FIG. 4, reference numeral 34 designates an antennal adapted to receive television broadcasting waves from broadcasting stations; 37, a video signal processing circuit; and 38, a television picture tube made of a cathode-ray tube (CRT).

Before a signal receiver 30 is used, a data presetting operation to the memory 33 is carried out for each of the channels. It is determined whether or not broadcasting stations are assigned to the channels. That is, the presence or absence of a broadcasting station for each of the channels is preset in the memory 33. As for the channel for which a synchronizing signal is detected, its central frequency or frequency division ratio is preset in the memory 33.

By this data presetting operation, the channel number of an empty channel to which no broadcasting station is assigned is stored in the memory 33, and, the central frequencies of the signals of the channels which are tuned are stored in the memory 33. Hence, the resultant signal receiver 30 can be used as follows: That is, according to the channel specified by the operator, the CPU 31, the system control section, reads the central frequency of the specified channel from the memory 33, and applies it to the PLL circuit 322 of the PLL tuner section 32, so that phase-locking operation is started at the central frequency as a starting frequency.

The aforementioned data presetting operation will be described in more detail.

In the data presetting operation, it is necessary that, for each of the channels, a frequency tuning operation is automatically carried out, to detect whether or not a broadcasting signal is available; i.e., to store in the memory the presence or absence of a broadcasting signal for each of the channels.

In addition, it is necessary that, in the case where a broadcasting signal is available, its tuned frequency is determined, and stored in the memory.

FIG. 5 is a diagram showing sequential steps in the data presetting operation. In the data presetting operation, a method of selecting a station is generally as follows: The CPU 31 reads the central frequency data (initial value) of the first channel from the memory 33. With the data thus read as a reference, the PLL tuner section 32 operates so that a first sampling operation 21 is carried out. That is, during about 300 msec, the PLL circuit 322 performs a phase-locking operation at the central frequency. If the phase-locking operation is not materialized at the frequency, then it is determined that no synchronizing signal is detected at the frequency, and a second sampling operation 22 is effected. On the other hand, in the case where the phase-locking operation is materialized at the frequency, and a phase-locking signal is detected to determine that a synchronizing signal is detected, an operation 1 is effected.

In the operation 1, the system control section, namely, the CPU 31 outputs data every three steps (with an inter-step wait of 30 msec) with 31.25 KHz as one step, and receives an AFC signal from the PLL tuner section 32 for detection of an AFC variation. In the case where no AFC variation is detected within the range of ±2.44 MHz of the central frequency, after a suitable wait (of 30 msec for instance), the second sampling operation 22 is effected. When the AFC variation is detected within the aforementioned range, an operation 2 (not shown) is effected.

In the operation 2, after a wait of 100 msec, the CPU 31 outputs data every step (with an inter-step wait of 60 msec). When an AFC variation is detected within the range of ±2.44 MHz of the central frequency, then the contents of the memory are renewed with the data of the channel. On the other hand, in the case where no AFC variation is detected within the range, after a suitable wait (of 50 msec for instance), the second sampling operation 22 is effected.

In the second sampling operation 22, during about 150 msec, the PLL circuit 322 performs the phase-locking operation beginning with a frequency which is lower by 1.31 MHz than the central frequency. If the phase-locking operation is not materialized at the frequency, then it is determined that no synchronizing signal is detected at the frequency, and a third sampling operation 23 is effected. On the other hand, in the case where the phase-locking operation is materialized at the frequency, and the phase-locking signal is detected to determine that the synchronizing signal is detected, the operation 1 is effected, so that the above-described operations are carried out. The operation 1 and the operation 2 are as described above.

In the third sampling operation 23, during about 150 msec, the PLL circuit 322 performs the phase-locking operation beginning with a frequency which is lower by 2.06 MHz than the central frequency. If the phase-locking operation is not materialized at the frequency, then it is determined that no synchronizing signal is detected at the frequency, and a fourth sampling operation 24 is effected. On the other hand, in the case where the phase-locking operation is materialized at the frequency, and the phase-locking signal is detected to determine that the synchronizing signal is detected, the operation 1 is effected, so that the above-described operations are carried out. The operation 1 and the operation 2 are as described above.

If, in the first through third sampling operations, the phase-locking operation is not materialized, then a fourth sampling operation 24 is effected. In the fourth sampling operation 24, during about 150 msec, the PLL circuit 322 performs the phase-locking operation beginning with a frequency which is higher by 1.31 MHz than the central frequency. When the phase-locking operation is materialized at the frequency, and the phase-locking signal is detected to determine that the synchronizing signal is detected, the operation 1 is effected, so that the above-described operations are carried out. The operation 1 and the operation 2 are as described above. On the other hand, in the case where the phase-locking operation is not materialized at the frequency, then it is determined that the phase-locking operation is not materialized for the present channel, and a sampling operation for the next channel is effected.

As was described above, in the conventional television signal tuning device, the system control section detects the phase-locking signal by the phase-locked loop circuit, and confirms the tuning lock through the detection of the AFC variation; that is, it performs the two different operations. Hence, the tuning operation takes time, and accordingly in the data presetting operation the tuning operation takes a relatively long period of time.

SUMMARY OF THE INVENTION

Accordingly, an object of the invention is to eliminate the above-described difficulties accompanying the conventional television signal tuning device. More specifically, an object of the invention is to provide a television signal tuning device with which the tuning operation is achieved quickly, and the data presetting operation is accomplished in a short time.

In attaining the foregoing object, a first aspect of the invention provides a television signal tuning device comprising: channel selecting means which includes a phase-locked loop circuit and a tuner/IF section, to select one from among television broadcasting channels; memory means for storing a data table of central frequency data for starting a plurality of synchronizing-signal detecting operations, the central frequency data being set for each of the television broadcasting channels; synchronizing-signal detecting means for detecting a synchronizing signal from a video signal obtained by detecting and amplifying a signal output of the tuner/IF section; and control means which, in a channel selecting operation, causes the phase-locked loop circuit to perform a phase-locking operation for every data piece of the central frequency data according to the data table stored in the memory means, and which, when the synchronizing-signal detecting means detects the synchronizing signal in each phase-locking operation, stores present channel data and tuning data thereof in the memory means.

Further, a second aspect of the invention provides a television signal tuning device comprising: channel selecting means which includes a phase-locked loop circuit and a tuner/IF section, to select one from among television broadcasting channels; memory means for storing a data table of division ratio data of central frequency for starting a plurality of synchronizing-signal detecting operations, the division ratio data being set for each of the television broadcasting channels; synchronizing-signal detecting means for detecting a synchronizing signal from a video signal obtained by detecting and amplifying a signal output of the tuner/IF section; and control means which, in a channel selecting operation, causes the phase-locked loop circuit to perform a phase-locking operation for every data piece of the division ratio data according to the data table stored in the memory means, and which, when the synchronizing-signal detecting means detects the synchronizing signal in each phase-locking operation, stores present channel data and tuning data thereof in the memory means.

DETAILED DESCRIPTION OF THE PREFERRED EMBODIMENT

Figure 1:
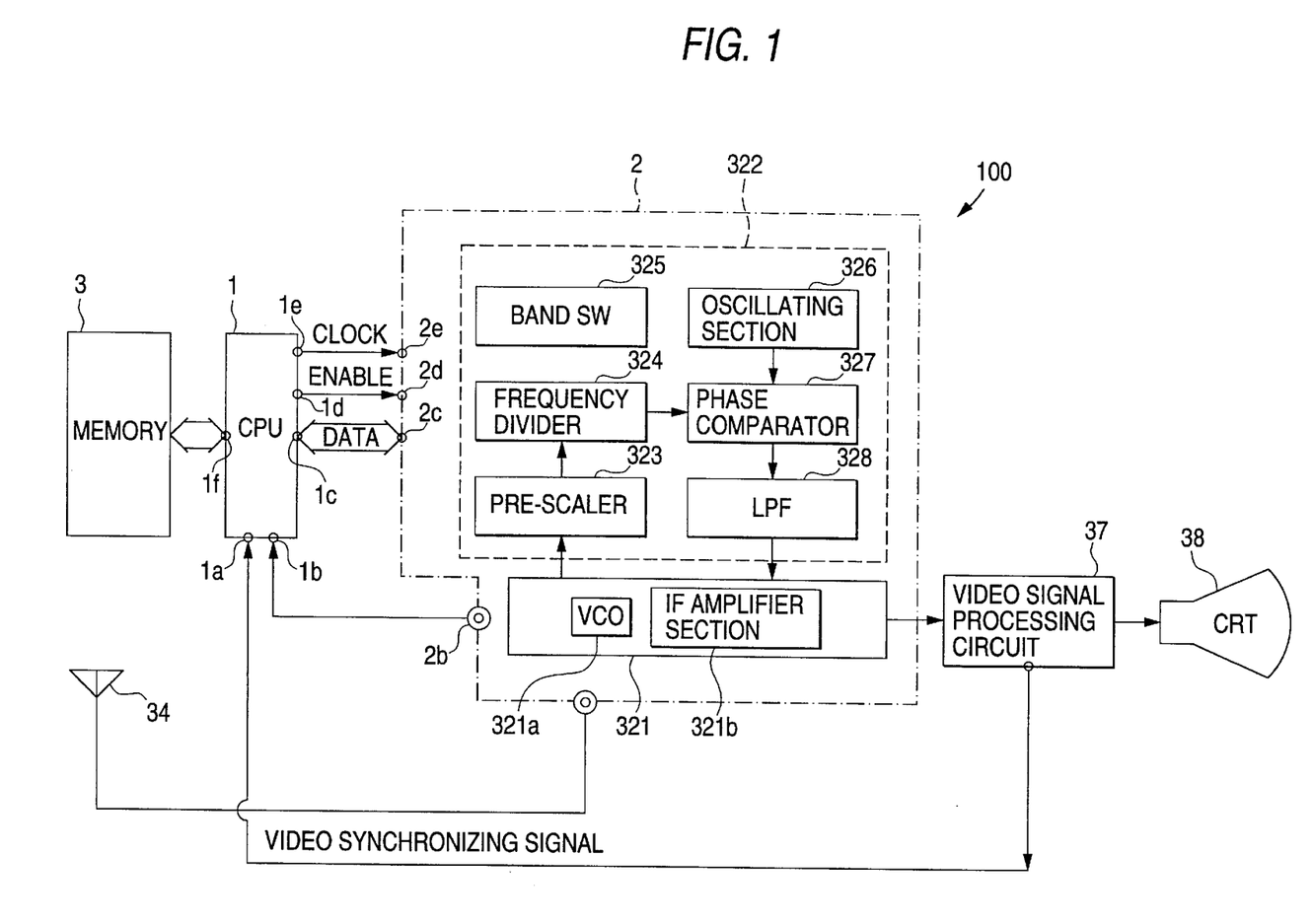
FIG. 1 is a block diagram showing a television signal tuning device, which constitutes an embodiment of the invention.
Figure 2:
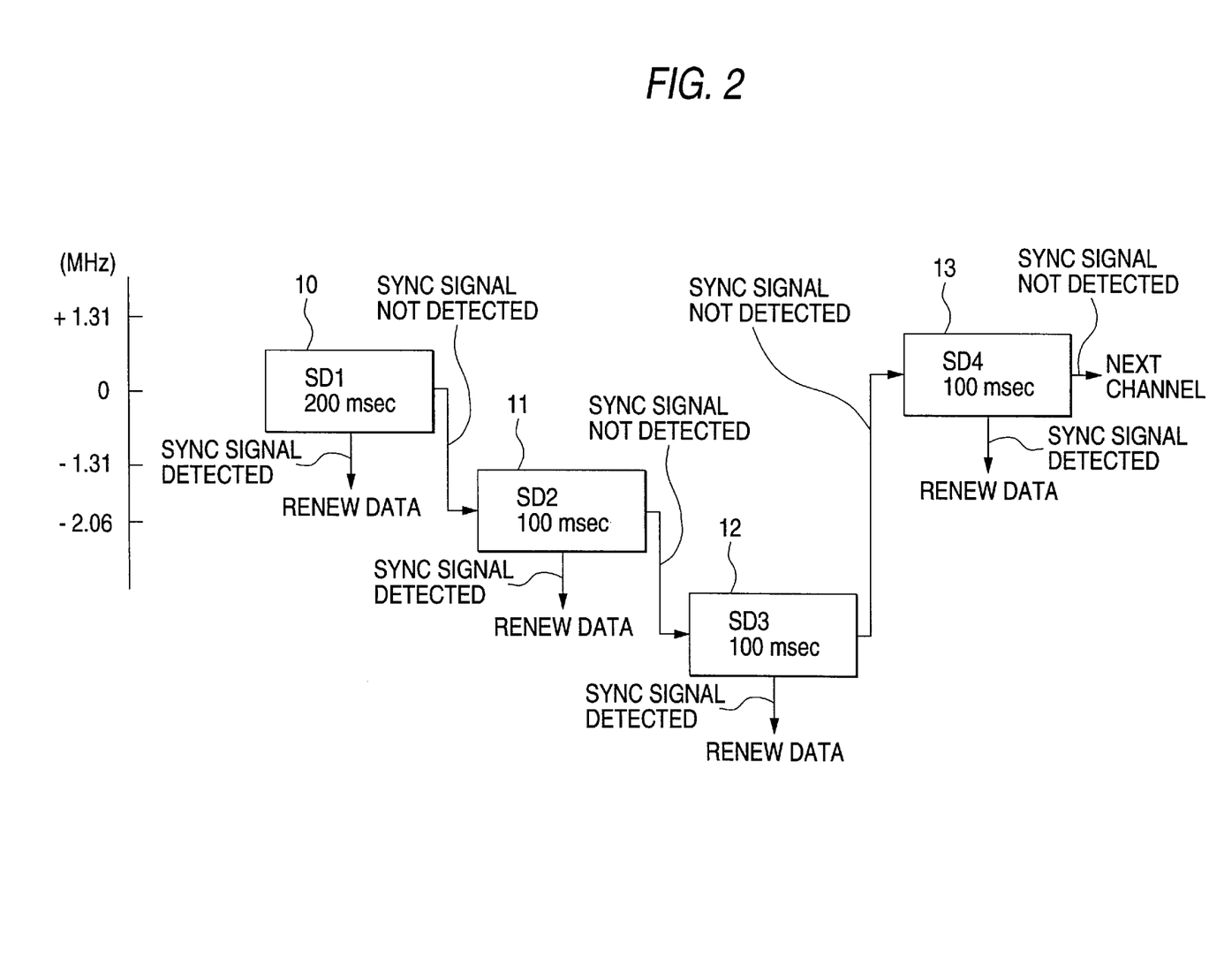
FIG. 2 is an explanatory diagram for a description of a data presetting operation in the device shown in FIG. 1.
Figure 3:
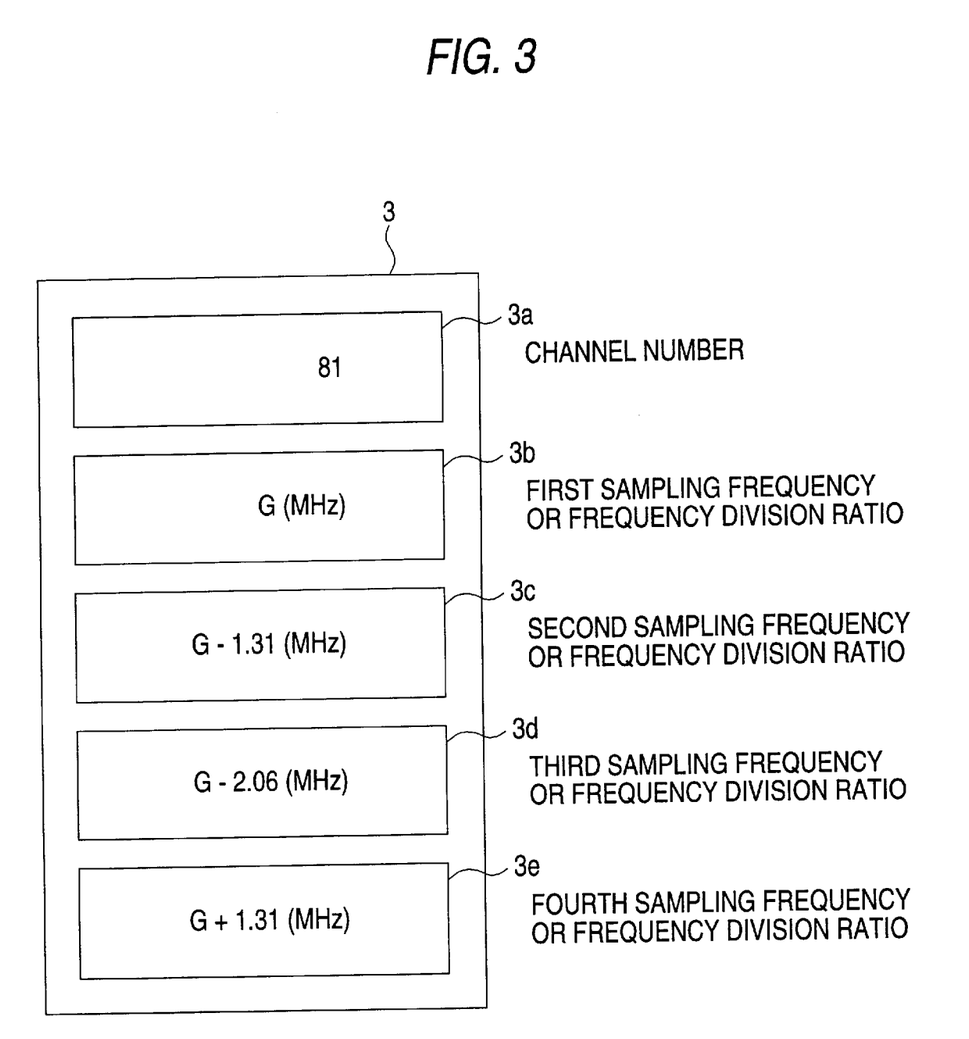
FIG. 3 is an explanatory diagram showing data stored in a memory provided in the device shown in FIG. 1.

A television signal tuning device, which constitutes an embodiment of the invention, will be described with reference to FIGS. I through 3.

FIG. 1 is a block diagram showing the arrangement of a television signal tuning device, which constitutes an embodiment of the invention. FIG. 2 is an explanatory diagram for a description of a data presetting operation in the device. FIG. 3 is an explanatory diagram showing data stored in a memory provided in the device. In FIG. 1, parts corresponding functionally to those already described with reference to FIG. 4 are therefore designated by the same reference numerals or characters.

As shown in FIG. 1, a signal receiver 100 having the television signal tuning device of the embodiment essentially comprises: a CPU 1 for controlling the system in its entirety; a PLL tuner section 2; a memory 3; and a video signal processing circuit 37. The CPU 1 comprises: a synchronizing-signal detecting port 1a for detecting a video synchronizing signal which is provided by the video signal processing circuit 37; an AFC signal detecting port 1b for detecting an AFC signal which is provided through an output port 2b of the PLL tuner section 2; a data input/output port 1c through which data are transmitted to and from the PLL tuner section 2; output ports 1d and 1e through which, with respect to output data, an enable signal and a clock signal are applied to input ports 2d and 2e of the PLL tuner section 2, respectively; and an input/output port 1f provided for the memory 3 which is adapted to store data on a selected signal-receiving channel number and the frequency (or frequency division ratio) thereof.

Before the signal receiver 100 is shipped out of the factory, the following data are stored as initial values in the memory 3 as shown in FIG. 3: a channel number 3a provided for each of the channels, a first sampling frequency, that is, the central frequency (or frequency division ratio) 3b of each of the channels, and second through fourth sampling frequencies 3c, 3d and 3e (which will be described later).

Before the signal receiver 100 is used for the first time, it is necessary to perform a data presetting operation to renew the initial values stored in the memory 3.

That is, for an empty channel to which no broadcasting station is assigned, no channel number is recorded, and for a channel for which a broadcasting signal is provided, the channel number thereof is recorded. Then, the frequency to which tuning is made in the data presetting operation is set as the central frequency 3b, thus renewing the initial values.

Hence, in the use of the signal receiver 100 whose initial values have been renewed in the above-described manner, according to a channel selected through a key input section (not shown) by the operator the CPU 1 reads from the memory 3 the central frequency of the channel thus selected and applies it to the PLL tuner section 2, so that the phase-locking operation is started with the central frequency as a starting frequency.

The aforementioned data presetting operation will be described with reference to FIG. 2.

In the data presetting operation, it is necessary that, for all the channels, a tuning operation is automatically carried out, to detect whether or not a broadcasting signal is available for each of the channels, thereby to store in the memory the presence or absence of a broadcasting signal for each of the channels, and that, in the case where a broadcasting signal is available, its tuning frequency is determined, and stored in the memory.

FIG. 2 shows operating steps in the data presetting operation. The data presetting operation employs a station selecting method as follows: First, the central frequency data (initial value) of the first channel is read from the memory 3. With the data thus read as a reference, the PLL circuit 322 of the PLL tuner section 2 operates to perform a first sampling operation 10.

That is, during about 200 msec, a phase-locking operation is performed at the central frequency. When the phase-locking operation is materialized, and a synchronizing signal is detected which the video signal processing circuit 37 applies to the synchronizing-signal detecting port 1a of the CPU 1, a data renewing operation is carried out; that is, the channel number 3a is stored in the memory 3, and the frequency to which tuning is made is stored as the central frequency 3b in the memory 3. Accordingly, the second through fourth sampling frequencies are also renewed. On the other hand, if the phase-locking operation is not materialized at the frequency, then it is determined that no synchronizing signal is detected at the frequency, and a second sampling operation 11 is effected.

More specifically, the above-described detection of the synchronizing signal during about 200 msec is performed every 10 msec (i.e., twenty times). In this case, the CPU 1 applies to the PLL circuit 322 every 10 msec station selecting data with a predetermined clock signal, turning on and off the enable signal; that is, the CPU 1 operates in this manner at most twenty times until the synchronizing signal is detected. Those signals are applied from the output ports 1c, 1d and 1e of the CPU 1 to the input ports 2c, 2d and 2e of the PLL tuner section 2.

In second, third and fourth sampling operations (which will be described later), during 100 msec, the detection of the synchronizing signal is performed every 10 msec (i.e., ten times) with an inter-step wait.

In the second sampling operation 11, during about 100 msec, the CPU 1 causes the PLL circuit 322 to perform the phase-locking operation beginning with a frequency which is lower by 1.31 MHz than the aforementioned central frequency read from the memory 3. When the phase-locking operation is materialized at with the frequency, and the synchronizing signal is detected, the data renewing operation is carried out; that is, the CPU 1 immediately operates so that the channel number 3a is stored in the memory 3, and the frequency to which tuning is made is stored as the central frequency 3b in the memory 3. Hence, the second through fourth sampling frequencies are also renewed.

On the other hand, if the phase-locking operation is not materialized at the frequency, then it is determined that no synchronizing signal is detected at the frequency, and the third sampling operation 12 is effected.

In the third sampling operation 12, during about 100 msec, the PLL circuit 322 performs the phase-locking operation beginning with a frequency which is lower by 2.06 MHz than the aforementioned central frequency. When the phase-locking operation is materialized at the frequency, and the synchronizing signal is detected, the data renewing operation is carried out; that is, the CPU 1 immediately operates so that the channel number 3a is stored in the memory 3, and the tuned frequency is stored as the central frequency 3b in the memory 3. Hence, the second through fourth sampling frequencies are also renewed.

On the other hand, if the phase-locking operation is not materialized at the frequency, then it is determined that no synchronizing signal is detected at the frequency, and the fourth sampling operation 13 is effected.

In the case where the phase-locking operation is not materialized in the first through third sampling operations, the fourth sampling operation 13 is effected. In the fourth sampling operation, during about 100 msec, the PLL circuit 322 performs the phase-locking operation beginning with a frequency which is higher by 1.31 MHz than the aforementioned central frequency which the CPU 1 reads from the memory 3. When phase-locking operation is materialized at the frequency, and the synchronizing signal is detected, the data renewing operation is carried out; that is, the CPU 1 immediately operates so that the channel number 3a is stored in the memory 3, and the tuned frequency is also stored as the central frequency 3b in the memory 3. Hence, the second through fourth sampling frequencies are also renewed.

If the phase-locking operation is not materialized at the frequency, it is determined that the phase-locking operation is not materialized for the present channel, and the channel number 3a is renewed blank, and the sampling operation is carried out for the next channel.

As was described above, in the television signal tuning device, when the formation of a phase-locked loop in the PLL circuit 322 is detected, the data in the memory 3 are immediately renewed, and the data renewing operation for the next channel is started. Hence, the device of the invention is free from the difficulty accompanying the conventional device that the system control section detects the phase-locking signal by the phase-locked loop circuit, and confirms the tuning lock through the detection of the AFC variation; that is, it performs the two different operations. Hence, the period of time required for the tuning operation is reduced; that is, the data presetting operation can be achieved quickly.

In the above-described embodiment, before the use of the signal receiver 100, the data presetting operation is carried out to renew the data in the memory. However, the system may be so modified that the data in the memory are automatically renewed in association with the operation of the signal receiver 100.

As was described above, the device of the invention has the memory which is adapted to store the central frequency data for starting the synchronizing-signal detecting operation for all the channels and the frequency division ratio data thereof. In the data presetting operation for each of the channels, the CPU causes the phase-locked loop circuit to perform the phase-locking operation for every data piece of the central frequency data or frequency division ratio data thereof which are stored in the memory for each channel. When the CPU detects a synchronizing signal from the video signal processing circuit in any one of the phase-locking operations which are successively performed by the phase-locked loop circuit, the CPU immediately renews the channel number and the tuning data thereof in the memory without performing the detection of the AFC variation. This feature greatly reduces the period of time required for the data presetting operation for each channel. Even if the signal receiver is moved to another television broadcasting area, the data in the memory can be readily renewed according to the television signals broadcasted in the area. Hence, the signal receiver with the device according to the invention is convenient in use.

What is claimed is:

1. A television signal tuning device comprising:

channel selecting means which includes a phase-locked loop circuit and a tuner/IF section, said channel selecting means performing a plurality of channel selecting operations in order to select channels to be stored during a channel setting operation, each channel selecting operation involving selecting one channel from among a plurality of television broadcasting channels;

memory means for storing a data table of central frequency data, said central frequency data being central frequency data of channels selected during said channel setting operation, for starting a plurality of synchronizing-signal detecting operations, the central frequency data being set for each of the television broadcasting channels;

synchronizing-signal detecting means for detecting, during said channel selecting operation, a synchronizing signal from a video signal obtained by detecting and amplifying a signal output of the tuner/IF section; and control means which, during said channel selecting operation, (a) causes the phase-locked loop circuit to perform a phase-locking operation for every data piece of the central frequency data according to the data table stored in said memory means;

(b) determines whether a broadcast signal is present or absent based solely on said detection of a respective presence or absence of said synchronizing-signal; and (c) when said synchronizing-signal detecting means detects the synchronizing signal in each phase-locking operation performed during said channel selecting operation to determine that a broadcast signal is present, stores present channel data and tuning data thereof in said memory means to thereby complete said channel setting operation for a selected channel, wherein the phase-locking operation is performed for every data piece of the central frequency data for a predetermined time.

2. A television signal tuning device comprising:

channel selecting means which includes a phase-locked loop circuit and a tuner/IF section, said channel selecting means performing a plurality of channel selecting operations in order to select channels to be stored during a channel setting operation, each channel selecting operation involving selecting one channel from among a plurality of television broadcasting channels;

memory means for storing a data table of central frequency data, said central frequency data being central frequency data of channels selected during said channel setting operation, for starting a plurality of synchronizing-signal detecting operations, the central frequency data being set for each of the television broadcasting channels;

synchronizing-signal detecting means for detecting, during said channel selecting operation, a synchronizing signal from a video signal obtained by detecting and amplifying a signal output of the tuner/IF section; and control means which, during said channel selecting operation, (a) causes the phase-locked loop circuit to perform a phase-locking operation for every data piece of the central frequency data according to the data table stored in said memory means, (b) determines whether a broadcast signal is present or absent based solely on said detection of a respective presence or absence of said synchronizing-signal; and (c) when said synchronizing-signal detecting means detects the synchronizing signal in each phase-locking operation performed during said channel selecting operation to determine that a broadcast signal is present, stores present channel data and tuning data thereof in said memory means to thereby complete said channel setting operation for a selected channel, wherein the central frequency data set for each of the television broadcasting channels comprises four data pieces including central frequency data of a present channel.

3. The device as claimed in claim 2, wherein the four data pieces includes the central frequency data of the present channel, data of a frequency lower by 1.31 MHz than the central frequency, data of a frequency lower by 2.06 MHz than the central frequency, and data of a frequency higher by 1.31 MHz than the central frequency.

4. A television signal tuning device comprising:

channel selecting means which includes a phase-locked loop circuit and a tuner/IF section, said channel selecting means performing a plurality of channel selecting operations in order to select channels to be stored during a channel setting operation, each channel selecting operation involving selecting one channel from among a plurality of television broadcasting channels;

memory means for storing a data table division ratio data of a central frequency, said division ratio data being central frequency data of channels selected during said channel setting operation, for starting a plurality of synchronizing-signal detecting operations, the division ratio data being set for each of the television broadcasting channels;

synchronizing-signal detecting means for detecting, during said channel selecting operation, a synchronizing signal from a video signal obtained by detecting and amplifying a signal output of the tuner/IF section; and control means which, during said channel selecting operation, (a) causes the phase-locked loop circuit to perform a phase-locking operation for every data piece of the division ratio data according to the data table stored in said memory means;

(b) determines whether a broadcast signal is present or absent based solely on said detection of a respective presence or absence of said synchronizing-signal; and (c) when said synchronizing-signal detecting means detects the synchronizing signal in each phase-locking operation performed during said channel selecting operation to determine that a broadcast signal is present, stores present channel data and tuning data thereof in said memory means to thereby complete said channel setting operation for a selected channel.

5. The device as claimed in claim 4, wherein the phase-locking operation is performed for every data piece of the division ratio data for a predetermined time.

6. The device as claimed in claim 4, wherein the division ratio data set for each of the television broadcasting channels comprises four data pieces including division ratio data of central frequency of a present channel.

7. The device as claimed in claim 6, wherein the four data pieces includes the division ratio data of central frequency of the present channel, division ratio data of a frequency lower by 1.31 MHz than the central frequency, division ratio data of a frequency lower by 2.06 MHz than the central frequency, and division ratio data of a frequency higher by 1.31 MHz than the central frequency.

* * * * *